(12) United States Patent
Sekiya et al.

(10) Patent No.: US 7,401,301 B2
(45) Date of Patent: Jul. 15, 2008

(54) CIRCUIT DESIGN SUPPORT METHOD, DEVICE THEREOF, AND CIRCUIT DESIGN SUPPORT PROGRAM

(75) Inventors: Hiroo Sekiya, Tokyo (JP); Yuichi Tanji, Takamatsu (JP); Takashi Yahagi, Tokyo (JP); Jianming Lu, Chiba (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 0 days.

(21) Appl. No.: 10/597,009

(22) PCT Filed: Jan. 7, 2005

(86) PCT No.: PCT/JP2005/000097

§ 371 (c)(1),
(2), (4) Date: May 22, 2007

(87) PCT Pub. No.: WO2005/066853

PCT Pub. Date: Jul. 21, 2005

(65) Prior Publication Data

US 2007/0300197 A1      Dec. 27, 2007

(30) Foreign Application Priority Data

Jan. 9, 2004    (JP)    ............................... 2004-003612

(51) Int. Cl.
*G06F 17/50*    (2006.01)

(52) U.S. Cl. .................................. 716/1; 716/5; 716/11
(58) Field of Classification Search ..................... 716/1, 716/5, 11
See application file for complete search history.

(56) References Cited

OTHER PUBLICATIONS

Ueta et al., "A Computation of Bifurcation Parameter Values for Limit Cycles", Jun. 1997, IEEE International Symposium on Circuits and Systems, Paper Digest, vol. 2, pp. 801-804.*
Hiroo Sekiya et al.; "Design of Generalized Class E2 DC/DC Converter"; Proceedings of the IEEE International Symposium on Circuits and Systmes 2002; May 26, 2002, USA, IEEE, pp. 823-826.—Cited in International Search Report, Document not Attached.

* cited by examiner

*Primary Examiner*—Sun J Lin

(57) ABSTRACT

To enable automatic calculation of a circuit element value and a waveform by a computer. In a circuit design support for calculating a circuit element value of an analog electronic circuit to be designed, by causing a computer to execute a program having a description of a repetition calculation equation of the Newton method including the Jacobi matrix, a program of the aforementioned calculation equation in which a partial differentiation as an element in the Jacobi matrix is replaced by an approximation equation is used. Furthermore, the element to be subjected to the partial differentiation in the Jacobi matrix is obtained from the waveform observed in response to the circuit configuration of the analog electronic circuit.

9 Claims, 1 Drawing Sheet

CIRCUIT DESIGN SUPPORT METHOD, DEVICE THEREOF, AND CIRCUIT DESIGN SUPPORT PROGRAM

BACKGROUND OF THE INVENTION

1. Field of the Invention

The present invention relates to a circuit design support method, a implement thereof, and a circuit design support program, and in particular, to a circuit design support method, a implement thereof, and a circuit design support program capable of automatically designing a circuit interactively through a designer and a computer without providing a circuit equation comprised of a differential equation.

2. Description of the Related Art

The information society of recent years has been under significant development, and increase in frequencies used for an electronic circuit has become increasingly prominent, for example, a computer CPU requires operating (clock) frequencies of the order of GHz, the use of frequencies of the order of GHz has also commenced in wireless communication, and the like. Accordingly, the development of an analog circuit has become extremely important, such as a power supply circuit for supplying power to a CPU and the like, and an amplifier used in wireless communication.

The design of an analog circuit connected to an electronic circuit of which the operating frequencies increase, such as a power supply circuit or an amplifier, is categorized into the following three stages:

(1) Decision of circuit configuration,
(2) Decision of a circuit element value, and
(3) Evaluation of circuit operation.

As a tool for supporting such design on a computer, a circuit simulator such as "SPICE" has been developed, which has been widely used as an important support tool for (3) above. However, in order to simulate circuit operation, a circuit element value needs to be provided, and therefore stage (2) above is essential which derives such an element value for providing a desired operation.

A developer of an analog circuit first performs circuit analysis through manual calculation and then use the result of that analysis to decide the element value of the circuit. The circuit analysis involves many approximations, and therefore the derived element value includes errors. Accordingly, the developer inputs the derived element value into a simulator, and then repeatedly performs the above works (2) and (3) to thereby empirically adjust the element value for the circuit on the basis of the simulation result. Moreover, adjustment of the element value is largely dependent on a designer's experience, and therefore training the designer is also necessary.

On the other hand, even if the element value is obtained with the Monte Carlo method using a simulator, there exists the problem that calculation time increases exponentially as the number of conditions to be satisfied increases. That is, stage (2) above that bridges the above (1) and (3) is a bottleneck in the development of a circuit in terms of time. For this reason, a design support tool with which even a less experienced designer can easily and rapidly design a circuit is strongly required.

In consideration of this, the present inventors previously proposed a method for calculating an element value, in which the element value was numerically derived with a computer, as described in the following non-patent literature. The prior method for calculating an element value will hereinafter be described.

For example, consider a circuit described with the differential equation represented by the following eq. (1).

$$\frac{dx}{dt} = f(t, x, \lambda), \tag{1}$$

where $t \in R$, $x \in R^n$, and $\lambda \in M^m$ represents time, an n-dimensional state space, and m-dimensional system parameters, respectively. For simplicity, we assume that $$f: R \times R^n \times R^m \to R^n (t, \chi, \lambda) \mapsto f(t, \chi, \lambda) \tag{2}$$

represents a $C^\infty$-class map having periodicity of period tT in a time domain. That is, $$f(t+t_T, \chi, \lambda) = f(t, \chi, \lambda) \tag{3}$$

represents the assumption. Furthermore, the above eq.(1) is assumed to have a solution of $x(t)=\phi(t,x_0,\lambda)$, if $-\infty<t<\infty$, with respect to any intitial value $x_0 \in R^n$ and all the sytem parameters $\lambda \in R^m$: $x(0)=\phi(0, x_0, \lambda)=x_0$.

The assumption of the periodicity described in eq. (3) enables a $C^\infty$-class discrete map T which returns from the state space $R^n$ to itself to be defined as:

$$T: R^n \to R^n \chi_0 \mapsto T(\chi_0, \lambda) = \phi(t_T, \chi_0, \lambda) \tag{4}$$

This map is referred to as the Poincare map.

In the case where the solution $x(t)=\phi(t,p_0,\lambda)$ of differential equation (1) has periodicity of period $t_T$, $$T(p_0, \lambda) = p_0 \tag{5}$$

the point $p_0 \in Rn$ satisfying eq. (5) is called a fixed point with respect to map T.

In order to design an electronic circuit, constraint conditions are often considered. Given that the number of conditions is N ($\leq m$), by expressing each condition at time $t=t_{ck}$ as $g_k$, the constraint condition can be expressed as:

$$G(x_0, \lambda) = \begin{bmatrix} g_1(t_{c1}, x_0, \lambda) \\ g_2(t_{c2}, x_0, \lambda) \\ \vdots \\ g_N(t_{cN}, x_0, \lambda) \end{bmatrix} = 0, \in R^N, \tag{6}$$

In this case, N parameters can be prepared as the design parameter. Consequently, the remaining (m−N) parameters need to be provided as the design specification.

As described above, the design of an electronic circuit comes down to solution methods of the above eqs. (5) and (6), which are algebra equations. These algebra equations are now rewritten as:

$$F(x_0, \lambda) = \begin{bmatrix} T(x_0, \lambda) - x_0 \\ G(x_0, \lambda) \end{bmatrix} = 0, \in R^{n+N} \tag{7}$$

where $T((x_0, \lambda)$, $x_0$, and $\lambda$ can be expresses as $T(x_0\lambda)=[T_1(x_0, \lambda, T_2(x_0, \lambda), \ldots, T_n(x_0, \lambda)]^T$, $x_0=x(0)=[x_1(0), x_2(0), \ldots, x_n(0)]^T$, and $\lambda=[\lambda 1, \lambda 2, \ldots, \lambda_m]^T$, respectively. Further, $\lambda_u \in R^N$ is defined as:

$$\lambda_u = \{\lambda_{u1}, \lambda_{u2}, \ldots, \lambda_{uN} | \lambda_{uk} \ (K=1, 2, \ldots, N) \text{ are unknown design parameters in } \lambda. \} \tag{8}$$

To solve design equation (7), the Newton method that is the most general algorithm for solving an algebra equation is used. The unknown in eq. (7) is expressed as $u \in R^{n+N}: u=[x_0^T, \lambda_u^T]^T$, and then an interative calculation:

$$u^{k+1} = u^k - \frac{F(u^k)}{F'(u^k)} \quad (9)$$

is performed until the termination condition of $\|^{k+1}u - u^k\| < \delta$ is satisfied, $$F'(u^k) = \begin{bmatrix} \frac{\partial T_1(u^k)}{\partial x_1(0)} - 1 & \frac{\partial T_1}{\partial x_2(0)} & \cdots & \frac{\partial T_1}{\partial x_n(0)} & \frac{\partial T_1}{\partial \lambda_{u1}} & \cdots & \frac{\partial T_1}{\partial \lambda_{uN}} \\ \frac{\partial T_2(u^k)}{\partial x_1(0)} & \frac{\partial T_2}{\partial x_2(0)} - 1 & \cdots & \frac{\partial T_2}{\partial x_n(0)} & \frac{\partial T_2}{\partial \lambda_{u1}} & \cdots & \frac{\partial T_2}{\partial \lambda_{uN}} \\ & & \vdots & & & & \\ \frac{\partial T_n(u^k)}{\partial x_1(0)} & \frac{\partial T_n}{\partial x_2(0)} & \cdots & \frac{\partial T_n}{\partial x_n(0)} - 1 & \frac{\partial T_n}{\partial \lambda_{u1}} & \cdots & \frac{\partial T_n}{\partial \lambda_{uN}} \\ \frac{\partial g_1(t_{c1}, u^k)}{\partial x_1(0)} & \frac{\partial g_1}{\partial x_2(0)} & \cdots & \frac{\partial g_1}{\partial x_n(0)} & \frac{\partial g_1}{\partial \lambda_{u1}} & \cdots & \frac{\partial g_1}{\partial \lambda_{uN}} \\ & & \vdots & & & & \\ \frac{\partial g_N(t_{cN}, u^k)}{\partial x_1(0)} & \frac{\partial g_N}{\partial x_2(0)} & \cdots & \frac{\partial g_N}{\partial x_2(0)} & \frac{\partial g_N}{\partial \lambda_{u1}} & \cdots & \frac{\partial g_N}{\partial \lambda_{uN}} \end{bmatrix} \quad (10)$$

In addition, k is the number of iterations and $\ll 1$ (where we assume $=10^{-9}$). In this case, $u^{k+1}$ is the solution of eq. (7).

In order to calculate eq. (9), it is required to obtain $T(u^k)$ in eq. (10), which can be obtained by applying the Runge-Kutta Method to eq. (1). Further, respective elements of the Jacobi matrix $F'(u^k)$ given by eq. (10) are derived by solving the following linear variational equations:

$$\frac{d}{dt}\frac{\partial \phi}{\partial x_0} = \frac{df}{dx}\frac{\partial \phi}{\partial x_0}, \text{ with } \frac{\partial \phi}{\partial x_0}\bigg|_{t=0} = I \quad (11)$$

$$\frac{d}{dt}\frac{\partial \phi}{\partial \lambda} = \frac{df}{dx}\frac{\partial \phi}{\partial \lambda} + \frac{\partial f}{\partial \lambda}, \text{ with } \frac{\partial \phi}{\partial \lambda}\bigg|_{t=0} = 0$$

Eqs. (11) can be regarded as differential equations with respect to $\partial(t, u^k)/\partial x_0$ and $\partial \phi(t, u^k)/\partial \lambda$. That is, if esqs. (11) are solved from 0 to $t_T$ or $t_{ck}$ with the Runge-Kutta Method, $\partial \phi(t_T, u^k)/\partial x_0$, $\partial \phi(t_{ck}, u^k)/\partial x_0$, $\partial \phi(t_T, u^k)/\partial \lambda$, and 7 $\phi(t^{ck}, u^k)/\partial \lambda$ can be derived. $T_k$ is a function of $\phi$, and also $g_k$ can typically be expressed as a function of $\phi$, and therefore, from these values, $T_k(u^k)/\partial x_0$, $T_k(u^k)/\partial \lambda$, $g_k(T_{ck,u}^k)/\partial x_0$, and $g_k(t_{ck}, u_k)/\partial \lambda$ can be numerically derived.

Conventionally, the unknown coefficient u has been obtained by the above-described calculation, and consequently $\bar{\lambda}_u$ that is the design value of the electronic circuit has been decided.

FIG. 2 is a flowchart illustrating a procedure in which a circuit design is performed using the above-described prior calculation procedure. The procedure is comprised of 5 steps: (1) the circuit configuration decision step of deciding electronic circuit configuration; (2) the circuit equation formulation step in which a circuit designer manually decides circuit equation (1) on the basis of the decided circuit configuration; (3) the variational equation derivation step in which a circuit designer derives the variational equations (11) from the circuit equation; (4) the constraint condition derivation step of deriving the constraint condition (eq. 7); and (5) the step of deriving a circuit element value and a waveform by solving conditional equation (7) with circuit equation (1) and variational equations (11), and if a satisfactory solution is not obtained in step 5, then an operation returns to step 1.

Non-patent literature 1: IEEE TRANSACTION ON CIRCUITS AND SYSTEM-1: fundamental theory and applications, vol. 49, No. 7, July 2002.

As described above, the prior method is configured to derive a voltage or current waveform $x(t)=\phi(t, x_0, \lambda)$ by providing the circuit equation in an explicit form following the consideration of circuit configuration and then solving the circuit equation. However, it is not easy to automatically derive the circuit equation with a computer, and therefore, there exists a problem of having to depend on manual calculation. Furthermore, every time a circuit configuration or the characteristic of a circuit element is modified, the circuit equation has to be reformulated, resulting in a large expenditure of time. In other words, in the prior method, a series of works, i.e., deriving the circuit equation from the circuit configuration and then deriving the variational equations constitute barriers to an automated design.

It is therefore a purpose of the present invention to provide a circuit design support method, a implement thereof, and a circuit design support program with which a circuit element value and a waveform can be derived automatically with a computer.

SUMMARY OF THE INVENTION

A circuit design support method, a implement thereof, and a circuit design support program according to the present invention is characterized by a circuit design support for calculating a circuit element value of an analog electronic circuit to be designed, by instructing a computer to execute a program describing an iterative calculation equation of the Newton method including the Jacobi matrix, wherein the program describing the calculation equation in which an approximate equation is substituted for a partial differentiation that is an element of the Jacobi matrix is used, and the element as the partial differentiation of the Jacobi matrix is obtained from a waveform observed in response to a circuit configuration of the analog electronic circuit.

The present invention is further characterized in that a steady state of the analog electronic circuit is obtained simultaneously with the calculation of the circuit element value.

The present invention is further characterized in that statistical data are provided as a constraint condition of the analog electronic circuit.

This configuration does not need describing a circuit equation of an analog electronic circuit as a differential equation. It also does not need applying the Runge-Kutta method to the linear variational equation to calculate the element as an object of the above-mentioned partial differentiation.

The present invention eliminates the needs for obtaining the element of the partial differentiation of the Jacobi matrix from linear variational equations and also for describing the circuit equation in an explicit form, so that manual calculation by a designer becomes unnecessary. Furthermore, statistical data can be provided as a constraint condition of an analog electronic circuit, so that the present invention can meet wider design requirements and facilitate setting constraint conditions.

DETAILED DESCRIPTION OF THE INVENTION

One embodiment of the present invention will hereinafter be described with reference to FIG. 1 and the equations used for describing the prior method.

FIG. 1 is a flowchart illustrating a procedure of a circuit design support method according to one embodiment of the present invention. The circuit design support method is comprised of step 11 of deciding a circuit configuration, step 12 of setting conditional equation (7), and step 13 of inputting the circuit configuration decided in step 11 into a circuit design support implement (hereinafter referred to as a "circuit simulator") to derive a waveform as described later and of solving the conditional equation input into the circuit simulator to thereby derive a circuit element value (a design value). In step 13, eq. (1) is also solved at the same time, and therefore a waveform equation when a condition is satisfied, i.e., a steady state of an analog electronic circuit is also derived.

Next, a circuit element value design support method according to this embodiment is described in comparison to the prior method.

In this embodiment, differential equation (1) is not set in an explicit form unlike the conventional method. That is, in a certain deterministic system (a system that can be described with differential equations) with respect to a variable x, it is assumed that a solution (output waveform) of $x(t)=\phi(t, x_0, \lambda)$ can be observed with respect to any initial value $x_0 \in R^n$ and all system parameters $\lambda \in Rm : x(0)=\phi(0, x_0, \lambda)=x_0$, where $x(t)$ has periodicity of period $t_T$ in a time domain.

Even under this assumption, following a consideration similar to the prior one causes the design of an electronic circuit to come down to the solution methods of eqs. (5) and (6), and rewriting these eqs. allows eq. (7) to be obtained and eq. (8) to be defined, where, in this embodiment, eq. (6) is not necessarily function of time $t_{C_1} \sim t_{C_n}$, but functions of $x_0$ and $\{\overline{\cdot\cdot}\}\lambda$. Consequently, in the prior method only a condition for a time response $\{\cdot\cdot\}\phi$ at a certain time $t_C$ derived from the circuit equation can be included in a constraint condition of an analog electronic circuit, whereas, in this embodiment, a waveform observed on a circuit simulator, and statistical data such as the maximum value, the minimum value, and the mean value of observations calculated from the waveform can be used as constraint conditions. For example, statistical values of time responses $\{\cdot\cdot\}\phi$ derived from the circuit equation, observations in a domain other than a time domain, such as the Fourier domain of, and statistical values of the observations can be used as the constraint conditions.

As a solution method of eq. (7), this embodiment also employs the Newton method, and eq. (9), which is an iterative calculation, is iteratively calculated until the termination condition is satisfied. In this calculation, the use of the Jacobi matrix (10) is also the same as in the prior method, and $u^{k+1}$ is the solution of eq.(7).

Then, in this embodiment, $T(u^k)$ for calculating eq. (9) is derived from observed $x(t)=\phi(t, x_0, \lambda)$. On the other hand, the elements of the Jacobi matrix $F'(u^k)$ (10) cannot be solved with variational equations (11) since circuit equation (1) is not described in an explicit form in this embodiment, differently from the prior method.

Therefore, in this embodiment, instead of the variational equations, a partial differentiation that is each of the elements of the Jacobi matrix is replaced by an approximate equation based on a definition. That is, when $$u_{\epsilon i}=[u_1, u_2, \ldots, u_i+\epsilon, \ldots, u_{n+N}] \quad (12)$$

is defined, the following approximate equation (13) is substituted for a value of the partial differentiation that is each of the elements of the Jacobi matrix.

$$\frac{\partial g(u^k)}{\partial u_i} = \frac{g(u_{\epsilon i}^k) - g(u^k)}{\epsilon} \quad (13)$$

where $\{\overline{\cdot\cdot}\}\epsilon$ is an infinitesimal coefficient $g(u_{\epsilon i})$ can be derived by substituting $u_{\epsilon i}$ for a parameter u of $g(u)$ in the same deterministic system (circuit configuration) as that for deriving $g(u)$.

From the above calculations, the unknown coefficient u can be obtained, and consequently the design value $\{\cdot\cdot\}\lambda_u$ is decided, whereby the design of the electronic circuit becomes possible.

According to this embodiment described above, since a partial differentiation is derived only from an output waveform, a variational equation is not necessary, and also, since a circuit equation is not given in an explicit form but in an implicit form, a manual circuit design process becomes unnecessary and performing all the circuit design processes becomes possible interactively with a computer.

Furthermore, even in the case of design change of a circuit element, i.e., even in the case where a deterministic system is changed, a parameter for obtaining a periodic orbit can be easily derived in each case and the change can be easily responded to since an approximate value is substituted for a value of a partial differentiation. Still further, in comparison to FIG. 2 illustrating the prior method, this embodiment is configured to eliminate the formulation of the circuit equation (step 2) and the derivation of variational equations (step 3), and to substitute an approximate equation for a value of a partial differentiation, so that a large change in an internal configuration of a simulator is not required. Consequently, a circuit simulator in this embodiment can effectively utilize properties of other existing simulators such as "SPICE".

INDUSTRIAL APPLICABILITY

The present invention enables a computer to calculate a circuit element value without providing a circuit equation when an electronic circuit is designed, so that the circuit design support implement enabling an electronic circuit to be designed in a fully automatic mode can be configured, which is useful for designing an analog electronic circuit and an mixed analog/digital circuit, especially a switching circuit.

Figure 1:
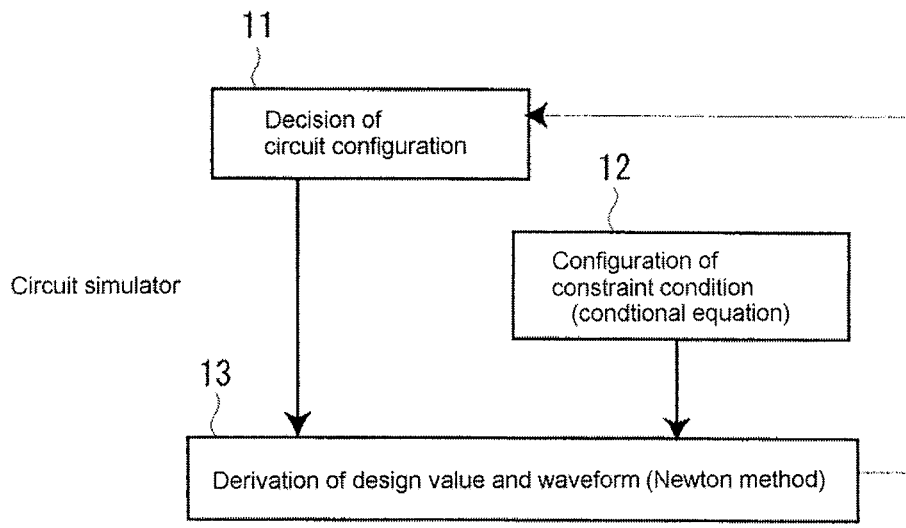
FIG. 1 is a flowchart illustrating a procedure of a circuit design support method according to one embodiment of the present invention.
Figure 2:
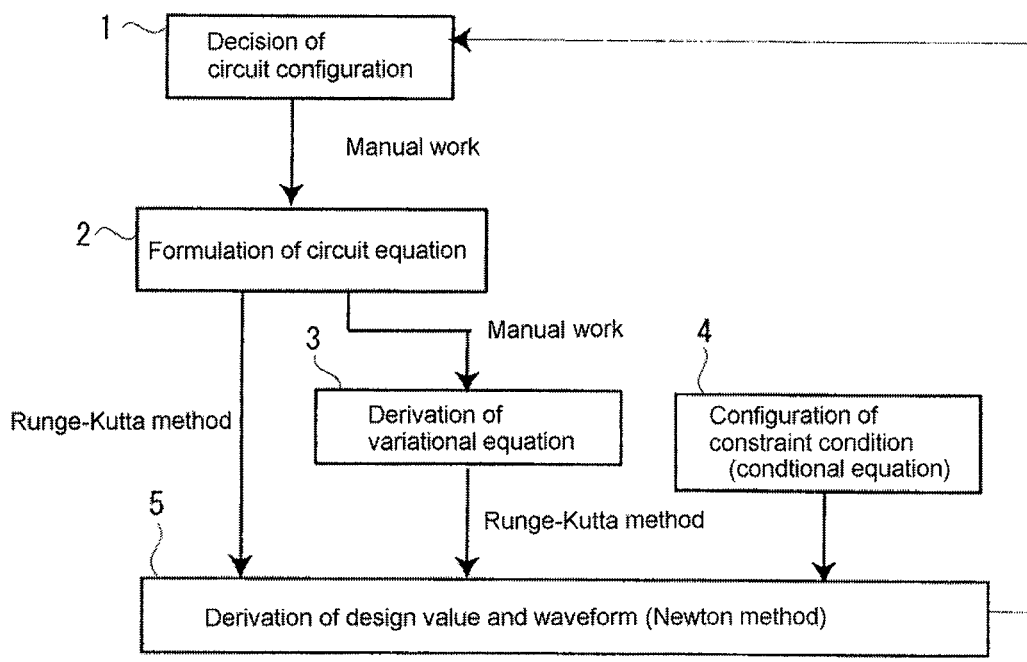
FIG. 2 is a flowchart illustrating a procedure of a prior circuit design support method.

What is claimed is:

1. A circuit design support method for instructing a computer to execute a program describing an iterative calculation equation of a Newton method including a Jacobi matrix to thereby calculate a circuit element value of an analog electronic circuit to be designed, wherein the program, that describes the iterative calculation equation in which an approximate equation is substituted for a partial differentiation which is an element of the Jacobi matrix is used, and the element of the Jacobi matrix is obtained from a waveform observed in response to a circuit configuration of the analog electronic circuit.

2. The circuit design support method according to claim 1, wherein a steady state of the analog electronic circuit is obtained simultaneously with a calculation of the circuit element value.

3. The circuit design support method according to claim 1, wherein statistical data is provided as a constraint condition of the analog electronic circuit.

4. A circuit design support implement for executing a program describing an iterative calculation equation of a Newton method including a Jacobi matrix to thereby calculate a circuit element value of an analog electronic circuit to be designed, wherein the program, that describes the iterative calculation equation in which an approximate equation is substituted for a partial differentiation which is an element of the Jacobi matrix, is used, and the element of the Jacobi matrix is obtained from a waveform observed in response to a circuit configuration of the analog electronic circuit.

5. The circuit design support implement according to claim 4, wherein a steady state of the analog electronic circuit is obtained simultaneously with a calculation of the circuit element value.

6. The circuit design support implement according to claim 4, wherein statistical data is provided as a constraint condition of the analog electronic circuit.

7. A circuit design support program for instructing a computer to calculate an iterative calculation equation of a Newton method including a Jacobi matrix to thereby calculate a circuit element value of an analog electronic circuit to be designed, wherein the iterative calculation equation uses an approximate equation to substitute for a partial differentiation which is an element of the Jacobi matrix, and the element of the Jacobi matrix is obtained from a waveform observed in response to a circuit configuration of the analog electronic circuit.

8. The circuit design support program according to claim 7, wherein a steady state of the analog electronic circuit is obtained simultaneously with a calculation of the circuit element value.

9. The circuit design support program according to claim 7, wherein statistical data is provided as a constraint condition of the analog electronic circuit.

* * * * *